United States Patent
Bollen et al.

(10) Patent No.: US 10,598,754 B2
(45) Date of Patent: Mar. 24, 2020

(54) PRECISION MAGNETIC FIELD MONITORING IN HIGH RADIATION ENVIRONMENTS

(71) Applicant: BOARD OF TRUSTEES OF MICHIGAN STATE UNIVERSITY, East Lansing, MI (US)

(72) Inventors: Georg Bollen, East Lansing, MI (US); Ryan Ringle, Lansing, MI (US)

(73) Assignee: BOARD OF TRUSTEES OF MICHIGAN STATE UNIVERSITY, East Lansing, MI (US)

( * ) Notice: Subject to any disclaimer, the term of this patent is extended or adjusted under 35 U.S.C. 154(b) by 364 days.

(21) Appl. No.: 15/504,251

(22) PCT Filed: Aug. 21, 2015

(86) PCT No.: PCT/US2015/046228
§ 371 (c)(1),
(2) Date: Feb. 15, 2017

(87) PCT Pub. No.: WO2016/029081
PCT Pub. Date: Feb. 25, 2016

(65) Prior Publication Data
US 2017/0276757 A1    Sep. 28, 2017

Related U.S. Application Data

(60) Provisional application No. 62/040,776, filed on Aug. 22, 2014.

(51) Int. Cl.
*G01R 33/64* (2006.01)
*G01R 33/24* (2006.01)
(Continued)

(52) U.S. Cl.
CPC ......... *G01R 33/64* (2013.01); *G01R 1/06772* (2013.01); *G01R 33/1215* (2013.01); *G01R 33/24* (2013.01); *G01R 33/44* (2013.01)

(58) Field of Classification Search
CPC ........ G01R 33/64; G01R 33/24; G01R 33/12; G01R 33/1215; G01R 33/44;
(Continued)

(56) References Cited

U.S. PATENT DOCUMENTS 5,847,391 A   12/1998 Sephton et al.
7,928,371 B2   4/2011 Ryjkov
(Continued)

OTHER PUBLICATIONS

Lincoln., "First direct double-beta decay Q-value measurement of the neutrinoless double-beta decay candidate 82Se and development of a high-precision magnetometer.", (20130000), pp. 1-71, URL: https://publications.nscl.msu.edu/thesis/Lincoln2013_363.pdf, [Y] 1-13.
(Continued)

*Primary Examiner* — Son T Le
(74) *Attorney, Agent, or Firm* — Marshall, Gerstein & Borun LLP

(57) ABSTRACT

A high-precision magnetometer based on a miniature Penning trap is used to measure high magnetic field strengths with very high accuracy. Due to the high precision of the developed miniature charged particle trap, magnetic field strengths can be measured with an accuracy of 1 part per million or greater, including up to and above 1 part per billion. The charged particle trap has been configured to operate with such precision in environments of high radiation, e.g., 1 MGy or above.

13 Claims, 11 Drawing Sheets

(51) Int. Cl.
*G01R 1/067* (2006.01)
*G01R 33/12* (2006.01)
*G01R 33/44* (2006.01)

(58) Field of Classification Search
CPC ............ G01R 33/067; G01R 33/06772; G01R 33/02; G01R 33/0213
See application file for complete search history.

(56) References Cited

U.S. PATENT DOCUMENTS

| | | |
|---|---|---|
| 8,704,173 B2 | 4/2014 | Nikolaev et al. |
| 2011/0221456 A1* | 9/2011 | Fronheiser .......... C04B 35/5607 324/663 |

OTHER PUBLICATIONS

International Search report and Written Opinion from PCT/US2015/046228 dated Nov. 9, 2015.

* cited by examiner

PRECISION MAGNETIC FIELD MONITORING IN HIGH RADIATION ENVIRONMENTS

CROSS-REFERENCE TO RELATED APPLICATIONS

This application claims the priority benefit under 35 U.S.C. § 119(e) of U.S. Provisional Patent Application No. 62/040,776, filed Aug. 22, 2014, the disclosure of which is incorporated herein by reference in its entirety.

STATEMENT OF GOVERNMENTAL INTEREST

This invention was made with government support under PHY1102511 awarded by the National Science Foundation. The government has certain rights in the invention.

BACKGROUND OF THE DISCLOSURE

Brief Description of Related Technology

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The mass of an atom or nucleus is one of its most fundamental properties and is important for various studies in physics. Penning Trap Mass Spectrometry (PTMS) facilities have been used to perform high-precision mass measurements on stable and short-lived isotopes. PTMS facilities have achieved mass measurement fractional precisions as small as 7 parts in $10^{-12}$ for stable isotopes and less than $10^{-8}$ for unstable isotopes. Because of the success of PTMS over the years, it is now considered to be the most precise and accurate method for determining atomic masses.

Located at the National Superconducting Cyclotron Laboratory (NSCL) on the campus of Michigan State University, the Low-Energy Beam and Ion Trap (LEBIT) PTMS facility (shown in FIG. 1) is the only PTMS facility that performs high-precision mass measurements on isotopes produced via projectile fragmentation. The high-energy (~100 MeV/u) rare isotopes are thermalized in a gas cell and delivered to the LEBIT facility for mass measurements. The LEBIT facility began performing mass measurements at the NSCL with a pilot experiment in 2005.

Since its commissioning, the LEBIT facility has measured the masses of more than forty rare isotopes of various elements with fractional precisions ranging from a few parts in $10^7$ to better than 5 parts in $10^9$. The LEBIT facility, and similar PTMS facilities, rely on mass measurements of an ion species whose mass is accurately known to calibrate the magnetic field before and after each rare isotope cyclotron frequency measurement. This technique works well. However, valuable beam time is needed to perform reference measurements and it does not account for non-linear magnetic field strength fluctuations. If non-linear magnetic field strength fluctuations are present, a broadening and shifting of the Time-Of-Flight (TOF) resonance curve could occur for measurements of rare isotopes with very low production rates, which require a longer measurement time to obtain a resonance.

Therefore, there is a need to measure short-term fluctuations of the magnetic field to a relatively high precision to increase efficiency and scientific output while improving the feasibility of performing mass measurements of extremely rare isotopes.

SUMMARY OF THE DISCLOSURE

A high-precision magnetometer based on a miniature Penning trap is used to measure high magnetic field strengths with very high accuracy. Due to the high precision of the developed miniature charged particle trap, magnetic field strengths can be measured with an accuracy of 1 part per million or greater, including up to and above 1 part per billion. The charged particle trap has been configured to operate with such precision in environments of high radiation, e.g., 1 MGy or above.

In accordance with an example, a device for measuring magnetic fields in a high radiation field environment, the device comprises: a charged particle trapping structure comprising two opposing end cap electrodes each on opposite ends of a central ring electrode structure, the opposing electrodes and the ring electrode structure collectively defining an inner chamber, with the inner chamber adapted (i) for generation of charged particles within the inner chamber through ionization of neutral atoms or molecules and adapted for trapping generated charged particles or (ii) for the capture and trapping of externally generated charged particles, in the presence of a magnetic field and a static electric potential created from voltages supplied to the charged particle trapping structure; a radio frequency generator coupled to the charged particle trapping structure to generate an electric field inside the inner chamber to excite or maintain cyclotron motion of the charged particles within the inner chamber, wherein the charged particle trapping structure is adapted to detect the cyclotron frequency of the charged particles within the inner chamber over an operating environment range of an accumulated radiation dose of 1 MGy or above; and an electronic detector adapted to determine a value of the detected cyclotron frequency and to determine a magnetic field strength of the magnetic from the cyclotron frequency.

In accordance with another example, a method for measuring the strength of a magnetic field, the method comprises: generating target charged particles within a Penning trap or injecting the target charged particles into the Penning trap; maintaining the target charged particles within the Penning trap, such that for a given trap radius and trap length, applying a static magnetic field and a quadrupole electric field within the Penning trap maintains the target charged particles within the Penning trap for at least a measurement cycle; measuring the cyclotron frequency using an image charge resonance detection technique measuring radial motion of the target charged particles; and determining a field strength of the magnetic field from the cyclotron frequency, wherein the Penning trap is sized for measuring the field strength with an accuracy of 10 parts per million or greater, over an operating environment radiation range of 1 MGy or above.

DETAILED DESCRIPTION

Techniques are described for precise measurement and continuous monitoring of high magnetic fields (>1 Tesla) in high radiation environments. The techniques are suitable to operate in radiation fields from gammas, neutrons, energetic charged particles as they are present in nuclear fusion reactors, and at particle accelerator and related systems. The techniques provide relatively high precision magnetic field measurement. Examples precision values achieved are 1 ppm or better or 10 ppm or better. And these precise measurements can be made over radiation doses greater than 1 MGy, greater than 10 MGy, or greater than 100 MGy, or any ranges therebetween.

The techniques use small-size Penning traps for the precise determination of the strength (e.g., B-field) of magnetic fields in a high radiation environment by determining the cyclotron frequency $\omega_c = 2\pi \cdot f_c = q/m \cdot B$ using a charged particle with well-known mass-to-charge ratio m/q. The magnetic fields may then be determined from the cyclotron frequency. The charged particles include, but are not limited to, electrons or light ions of stable isotopes. The charged particles are either produced inside the trap by ionization of a background gas present in an inner chamber of the Penning trap, or introduced into the inner chamber for ionization. Alternatively, the charged particles may be produced outside the Penning trap, and then transferred into the trap. The determination of the cyclotron frequency may be achieved through image charge resonance detection techniques such as Fourier Transform ion cyclotron resonance (FT-ICR) detection. Radiofrequency (RF) fields are generated inside the trap to excite the cyclotron motion of the stored particle to large orbits, and the image charge of the moving particle induced in the electrodes of the Penning trap is detected. While the Penning trap field probe is located in a suitable position of the magnet in a high radiation environment to be monitored, any radiation sensitive parts of the detection electronics (amplifiers, RF-generators and analyzers) are placed in a remote, sufficiently low radiation area.

Figure 11:
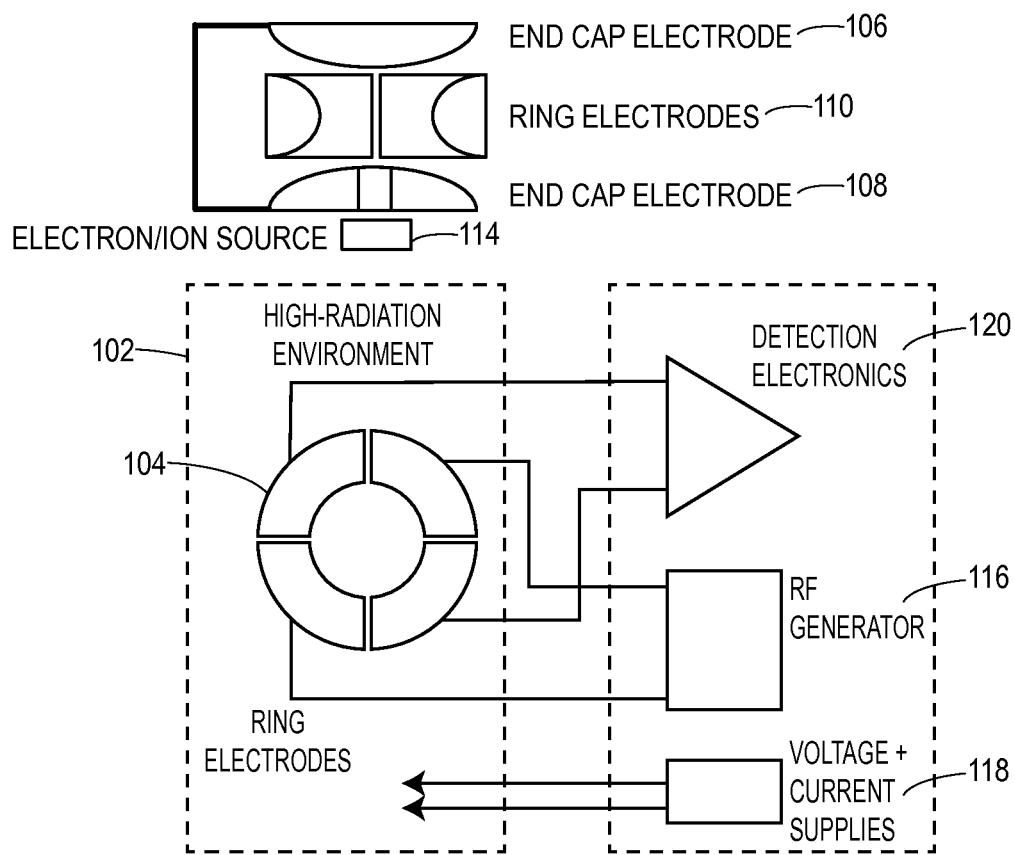
FIG. 11 is a schematic illustration of high-radiation environment magnetometer, in accordance with an example.

FIG. 11 illustrates a schematic 100 of a high-radiation environment magnetometer 102 using a small size Penning trap 104 (shown in cross-section in the upper left) combined with an ion or an electron source. The Penning trap 104 includes opposing end cap electrodes 106 and 108 and ring electrodes 110 (e.g., four ring electrodes), defining an inner chamber that is fed by a charged particle source 114, e.g., an electron/ion source. The Penning trap 104 is driven by an RF generator 116 that produces an RF field within the inner chamber through the ring electrode. A static voltage or current source 118 establishes a voltage difference across the end caps. An RF detector 120 is positioned to detect an RF signal resulting from the charged particles within the inner chamber. The charged particles are trapped in the Penning trap 104 and excited at their cyclotron frequencies to a cyclotron radius, by an oscillating electric field (i.e., from the resulting RF electric field in the inner chamber), and an orthogonal magnetic field in the inner chamber, where that magnetic field can be static or non-static. The RF detector 120 is able to determine changes (or perturbations) to the electric field. The RF detector 120 may include a signal amplifier and processor (not shown) for analyzing the received signal data and for performing a Fourier Transform on the data, applying Fourier Transform Ion Cyclotron Resonance (FT-ICR) mass spectrometry technique to determine the cyclotron frequency of charged particles stored in the trap based on their mass-to-charge ratio. The voltage supply 118, RF generator 116, and detection electronics 120 may be part of a computing device, which may also include a processor and a memory (not shown).

The Penning trap 104 is implemented at a size of material composition such that cyclotron frequency measurements, and resulting magnetic field strength measurements, can be made in high-radiation environments, as may be induced by gamma particles, neutrons, energetic charged particles, etc. as are present in nuclear fusion reactors, and in particle accelerator and related systems. Highly accurate cyclotron frequency measurements may be made with the Penning trap 104 operating in environment ranges of an accumulated radiation dose of up to 100 MGy or above. Example ranges include 1 MGy-10 MGy, 10 MGy-100 MGy, or 100 MGy or over. The measured cyclotron frequency may be determined at up to 10 parts per million or better over the operating environment range of the accumulated radiation dose, by way of example.

The techniques offer numerous advantages over conventional techniques. Nuclear magnetic resonance (NMR) probes, for example, offer some radiation tolerance by moving some electronics further away from the actual probe extends lifetime. NMR probes are not robust though and need to be replaced every few months, even for low power accelerator facilities (e.g., 400 W). The upcoming accelerator/target facilities operate in the tens of kW to MW range with correspondingly higher radiation fields. There is concern that the NMR probes will not be able to handle consistent measurements above 1 MGy in environmental radiation. Typical measurement precision is less than 1 ppm.

Probes based on optical rotation in crystals (e.g., Faraday Effect) have been proposed. The techniques are less accurate, typically around 100 ppm; and the radiation levels can damage crystal affecting their optical properties and thereby changing probe calibration and reducing sensitivity. Around 1 MGy or above in environmental radiation would deteriorate operation making the technique unusable. Expected measurement accuracies are in the 10-100 ppm range.

With the present techniques, however, the exclusive use of radiation resistant materials (specifically ceramics and metals, for example) for the Penning trap probe itself helps ensure that the present charged particle trap can withstand doses of 100 MGy without significant damage. The field determination method is very insensitive to any radiation induced changes of the properties of the material in the probe. The Penning trap based magnetic field probe is expected to reach a relative precision of 10 ppm and better, with precisions values of at or less than 0.1 ppm achievable.

The techniques have been implemented, in an example, to create a Penning trap high-precision magnetometer for use in the LEBIT facility. Such examples are discussed hereinbelow. It will be appreciated, however, that the techniques herein may be used in any particle beam propagating device.

The magnetometer formed with the present techniques may continuously track magnetic field fluctuations by monitoring the cyclotron frequency of a reference ion in a miniature Penning trap. An example of which was installed in the bore of the 9.4 T superconducting magnet and adjacent to the LEBIT facility's high-precision measurement trap shown in FIG. 2.

Charged particles in the presence of a magnetic field of strength B undergo cyclotron motion, a radial motion about the magnetic field as described by the Lorentz force, at a frequency $\omega_c = 2\pi * f_c = q/m \cdot B$, where q and m are the charge and mass of the particles, respectively. When charged particles are also axially confined inside a Penning trap, by superimposing an axial quadrupole electric field on top of a strong magnetic field, they undergo three basic eigenmotions, or normal-mode oscillations: one in the axial direction at a frequency $f_z$, and two in the radial direction at frequencies $f_-$ and $f_+$. The eigenmotion associated with frequency $f_-$, known as magnetron motion, is a result of the ExB drift motion and is typically much slower than the reduced cyclotron motion at the modified frequency of $f_+$. For particles in a Penning trap with a pure electric quadrupole potential, the radial frequencies of the eigenmotions are related to the true cyclotron frequency, $f_c$, by the expression, $f_+ + f_- = f_c$.

The magnetometer measures the radial cyclotron frequencies of a reference ion using the FT-ICR technique in which image charges induced on the electrodes of a Penning trap are detected. The FT-ICR technique is very well understood and has been utilized for many years in analytical chemistry to identify molecules and their proportions in a sample by detecting the motion of ions confined in a Penning trap.

Figure 3:
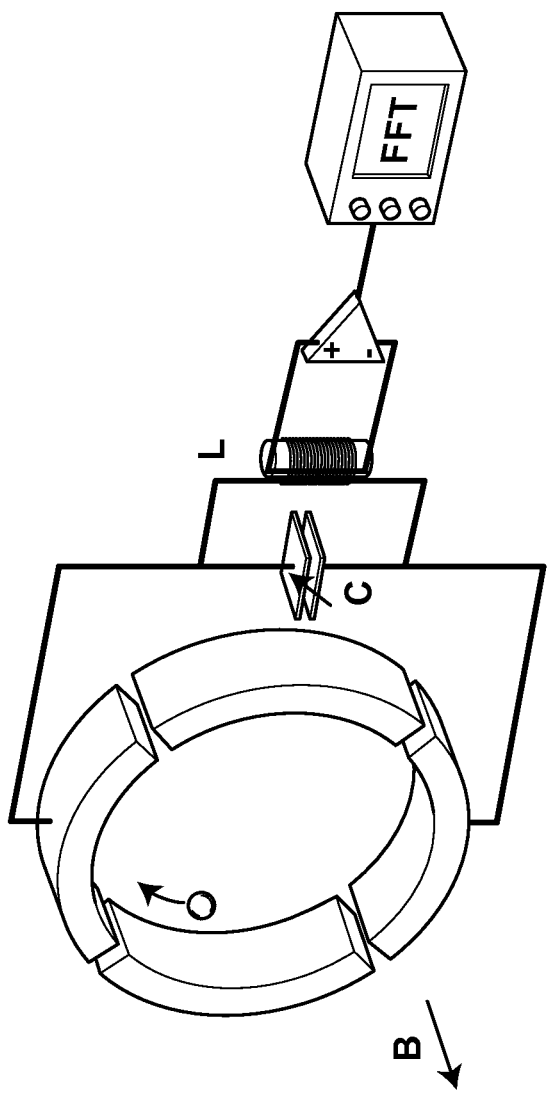
FIG. 3 circuit schematic illustration of detecting radial ion motion of trapped ions using a narrow-band FT-ICR technique, in which a variable capacitor C and inductor coil L create a resonant circuit. A pickup coil decouples the resonant circuit to reduce parasitic capacitance.

When using FT-ICR to determine the cyclotron frequency of charged particles, the number of trapped ions should be minimized to achieve the greatest precision when needed. This is used to minimize shifts to the frequency of the ion motion due to image. Detecting the fewest numbers of ions suggests maximizing the voltage signal delivered to an amplifier by utilizing the narrow-band FT-ICR detection method depicted in FIG. 3. The narrow-band FT-ICR detection method implements an LCR resonant circuit, with a resonant frequency equal to the frequency of the ion's motion, to further amplify the voltage signal above the background noise created by surrounding electronic equipment and the thermal noise of the electronics utilized to transfer and amplify the signal. In addition, to decreasing the uncertainty in a magnetic field measurement for a given frequency resolution, lighter mass ions should be used. For magnetometer applications with a desired large operating range and reduced precision, broad-band resonant FT-ICR detection is suitable.

Figure 4:
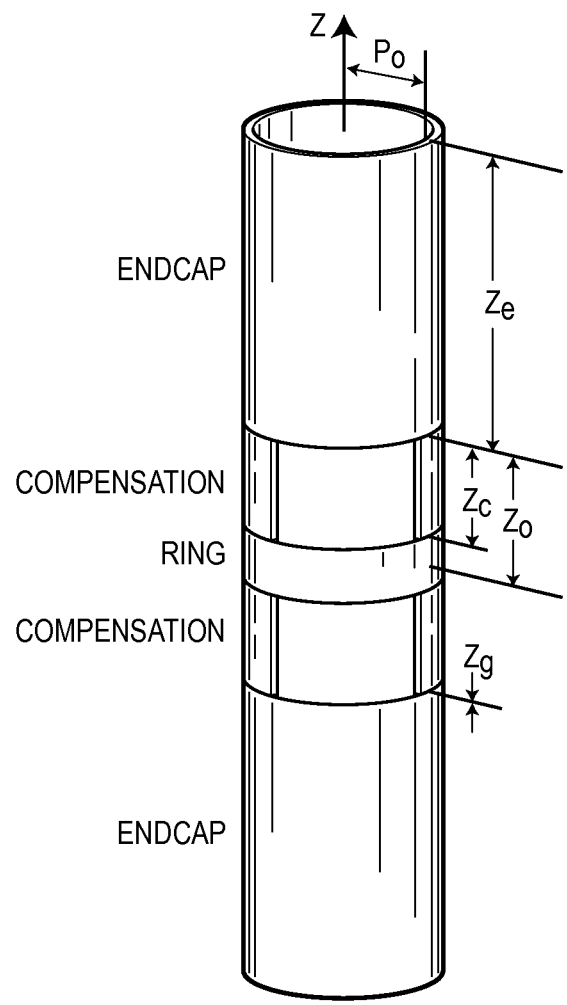
FIG. 4 depicts a cylindrical open-ended Penning trap electrode structure and dimensional nomenclature. The compensation electrodes each have fourfold segmentation.

A variety of trap geometries and electrode configurations may be used for FT-ICR mass spectrometry. The electrically compensated cylindrical trap in the open-ended configuration shown in FIG. 4 is an example implementation. The trap dimension nomenclature is also given, where $\rho_o$ and $z_o$ are the characteristic trap radius and length, respectively, $z_c$ and $z_e$ are the lengths of the compensation electrodes and the endcaps, respectively, and $z_g$ is the gap size between the electrodes. (Using this nomenclature convention, $z_c$ includes both gaps on either side of the compensation electrodes.) With such configurations, the overall size of a Penning trap can be described by the characteristic trap parameter, d, given by:

$$d = \sqrt{\frac{\rho_0^2}{4} + \frac{z_0^2}{2}} \quad (1)$$

Figure 1:
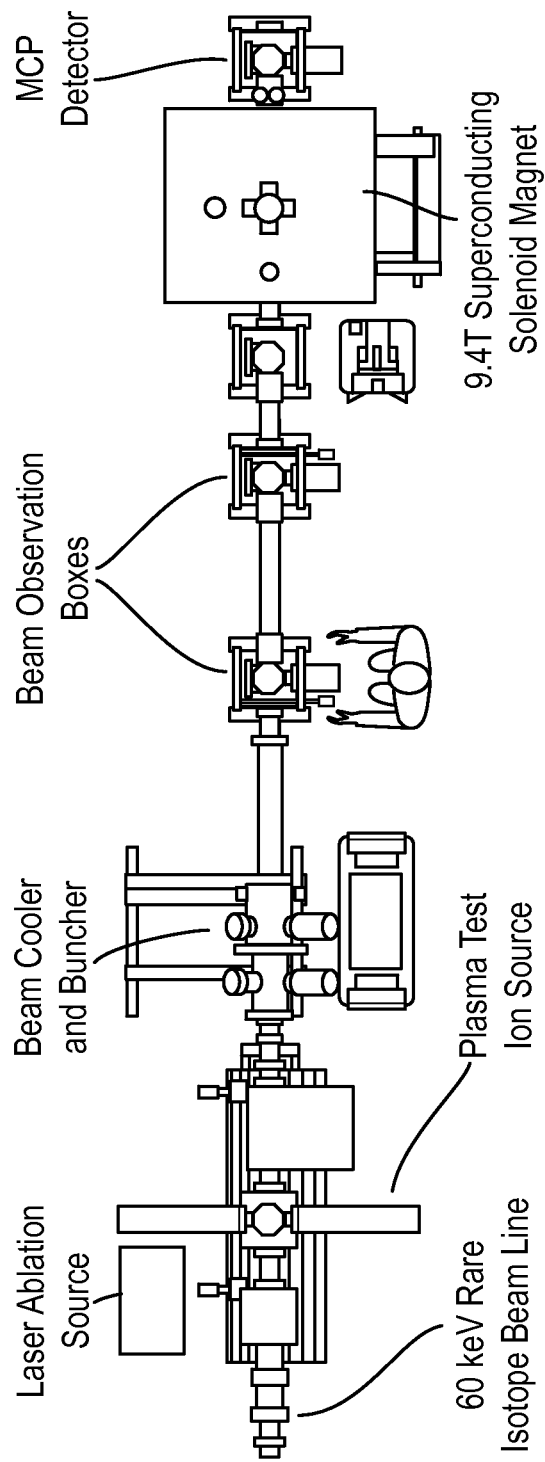
FIG. 1 is a schematic layout of a low-energy beam and ion trap (LEBIT) facility.
Figure 2:
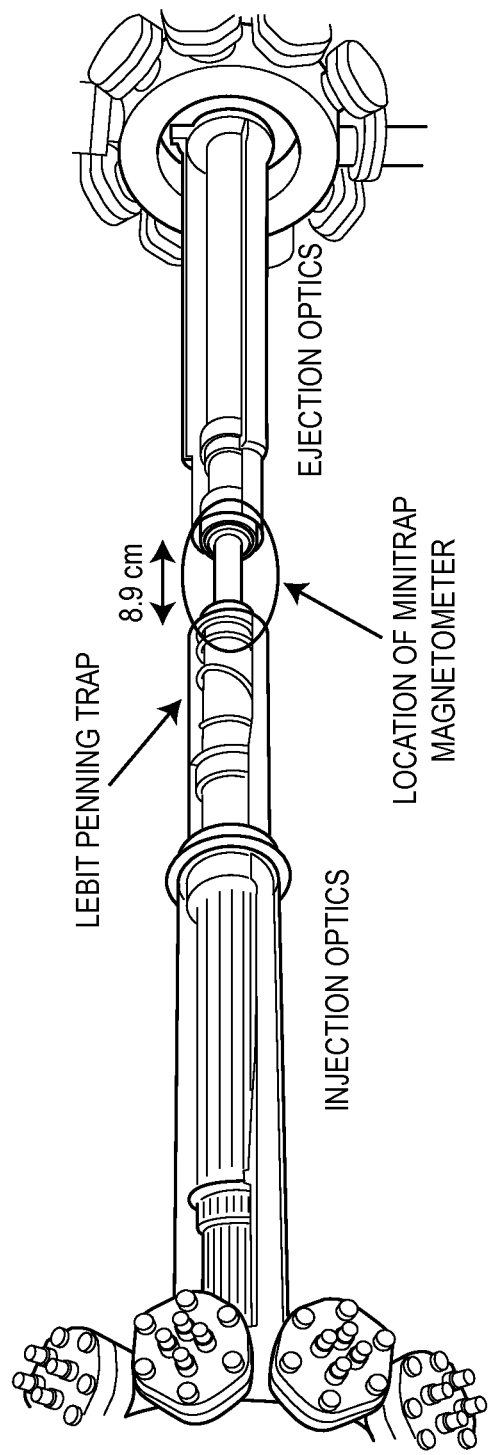
FIG. 2 is a schematic depicting a Penning trap magnetometer along with injection and ejection optics, in an example.

In the example of FIG. 2, the miniature Penning trap was designed to detect the cyclotron motion of light ions in a magnetic field with a field strength of 9.4 T. A major constraint on the trap size arises from the effects of special relativity. The effects of special relativity can be described as:

$$\frac{\Delta f_+}{f_+} \approx -\frac{1}{2}\left(\frac{qB}{mc}\right)^2 \rho_+^2, \quad (2)$$

and by propagation of errors:

$$\delta\left(\frac{\Delta f_+}{f_+}\right) \approx -\left(\frac{qB}{mc}\right)^2 \rho + \sigma_{\rho+}, \quad (3)$$

where c is the speed of light, and $\rho_+$ ($\sigma_{\rho+}$) is the radius (and its standard deviation) to which an ion cloud is excited with respect to the center of the trap. Eq. (3) indicates that the variation in $\omega_+$ is proportional to both the extent and the reproducibility of the radii to which the ions are excited, however, the mass of the ion plays a larger role. In a magnetic field strength of 9.4 T, for example, ionized diatomic hydrogen (with an atomic mass of 2) can be excited to $\rho_+ \approx 1.5$ mm before the effects of special relativity become non-negligible compared to a desired precision of 1 part in $10^8$. If a lower precision is sufficient the radius can be increased. Additionally, ions executing cyclotron motion with a larger fractional radius ($\rho_+/\rho_o$) induce a larger image current on the detection electrodes. The trap should thus be as small as possible to minimize the effects of special relativity and to also maximize the induced image current.

A careful analysis of the trapping potential was performed to determine the minimum trap size for an allowable range of electrostatic field imperfections. In a cylindrical Penning trap, for example, the electrostatic potential produced is only approximately quadratic near the center of the trap. To quantify the anharmonicities present near the center of the trap (r<<d) the electrostatic potential, V, is usually expanded as a series of Legendre polynomials:

$$V = \frac{V_0}{2} \sum_{n=0}^{\infty} C_n \left(\frac{r}{d}\right)^n P_n(\cos\theta), \quad (4)$$

where $V_o$ is the potential difference between the ring and endcap electrodes and the dimensionless coefficients, $C_n$, describe the strength of the multipoles present. The even $C_n$ coefficients for n>2 in the actual potential indicate the degree of anharmonicities present in the trapping potential. Such anharmonicities lead to frequency shifts and need to be minimized in the trap design.

Analytical and numerical simulations were performed to determine the trap electrode dimensions and the allowable machining tolerances that produce an electric quadrupole field with minimum contribution to higher order terms.

An orthogonalized trap geometry is implemented for the Penning trap. Orthogonalizing a trap is accomplished by choosing the value of $\rho_o/z_o$ that allows $C_2$ (and the axial frequency of the trapped ions) to become independent of the voltages applied to the compensation electrodes. By using the orthogonalized geometry, shifts to the radial eigenfrequencies caused by trap tuning are, in principle, eliminated. The normalized radii and compensation electrode heights to orthogonalize the open-ended trap of cylindrical geometry (without gaps) were found.

Numerical simulations were carried out in SIMION 8.0 to verify the analytical results and to determine the proper dimensions that would allow for realistic trapping potentials and achievable machining tolerances. The simulations using the SIMION code provide trapping potentials created from various electrode configurations. The values of the potentials associated with each electrode along the z-axis of the trap (in the trapping region the size of $z_o$) are extracted and a Mathematica routine is used to adjust the ring and endcap electrode potentials to provide an overall on-axis potential with $C_4=0$. The routine performs a best fit to the overall on-axis potential created by SIMION, and calculates the relevant $C_n$ terms. An F-test on the fit to the on-axis potential indicated that only the first five even terms are needed to describe the on-axis potential. The results of the optimal trap parameters and the corresponding electrode voltages together with the lowest-order even $C_n$ coefficients from the analysis are given in Table 1, where the tolerances were determined by constraining $|C_6|$ to <0.01. To achieve $|C_6|<0.01$, the electrodes need to be machined with tolerances <0.013 mm.

Figure 5:
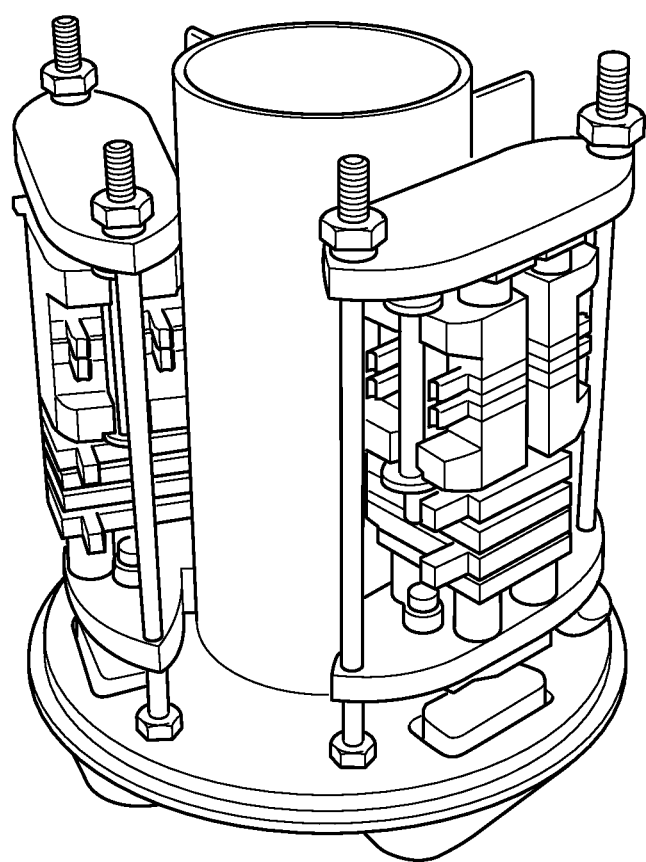
FIG. 5 is an image of a fully assembled Penning trap (with the routing wires and top half of the annular enclosure removed), in an example.
Figure 6:
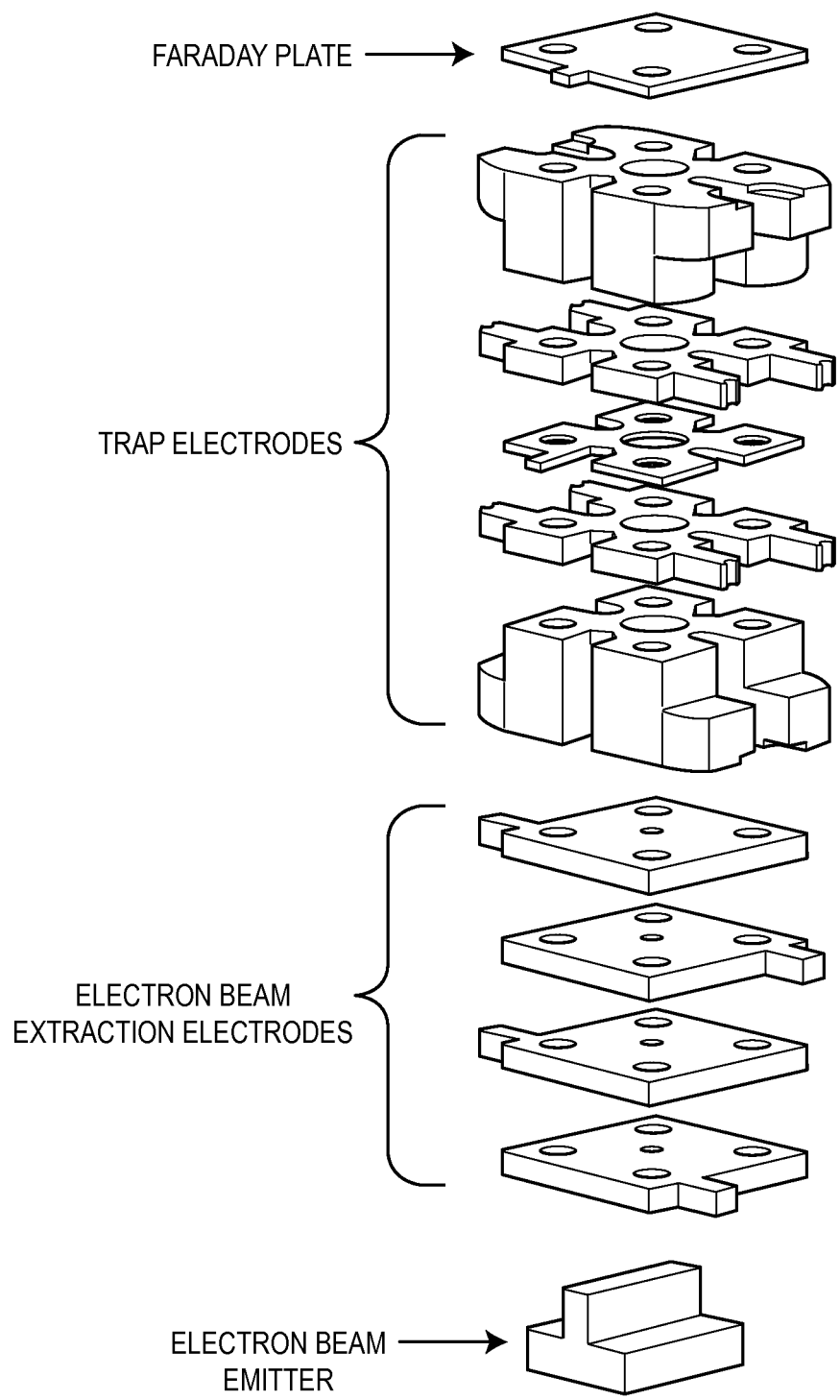
FIG. 6 illustrates an exploded view of the four main electrode sections of Penning trap, forming an inner chamber. The central hole of the trap electrodes makes up the corresponding cylindrical electrode; the four additional holes and square slots are for mounting and aligning the trap electrodes, respectively. The tabs on each electrode provide a mechanism to attach the wires used to apply voltages to the electrodes and/or pick up the ion signal.

An example Penning trap magnetometer assembled for the LEBIT is shown in FIG. 5, where the top half of the enclosure has been removed. By way of example, the magnetometer package utilizes an annular enclosure with a length of 7.5 cm, and inner and outer diameters of 2.86 cm and 7.3 cm, respectively. The annular geometry allows the package to be mounted onto the ejection drift tube located immediately downstream of the hyperbolic trap in the bore of the 9.4 T superconducting magnet of LEBIT.

The electron beam emitter was installed onto a shelf that allows mounting, operation, and easy replacement of commercial thermionic emitters or Field Emission Points (FEPs) fabricated by the LEBIT team. Four extraction electrodes, consisting of Oxygen-Free Electronic (OFE) copper electrodes 3 mm in thickness with 1 mm diameter holes machined through the center, are implemented to provide potentials to not only extract the beam from the FEP, but also to block or pass the electron beam to ionize the background gas without changing the beam's energy. For insulation, four ceramic washers are placed between each electrode and are aligned by four ceramic mounting rods which extend though the extraction electrodes, trap electrodes, and Faraday plate.

The trap electrodes, also machined from OFE copper, were gold plated to reduce possible patch effects that could produce an inhomogeneous surface charge distribution. Conventionally, the ring electrode is segmented four-fold for image charge detection and for creating RF fields to excite the ions. For the Penning trap, a four-fold segmentation of the compensation electrodes has been chosen instead in order to maximize the surface area of the detection electrodes, thus increasing the induced image current. The complete trap electrode structure obtains proper axial spacing and isolation through the use of 125 µm thick kapton sheets located between each electrode, perpendicular to the trap axis.

In the illustrated example of FIG. 5, a Faraday plate, located just downstream of the trap electrodes, was used to measure the electron beam current that passes through the trap. Axial alignment of the trap with respect to the enclosure is accomplished with two titanium threaded rods that extend through aluminum mounting plates and the annular enclosure and provides the compression, through the use of nuts and copper-beryllium springs, to hold the Penning trap assembly together. UHV sub-D connectors composed of PolyEther Ether Ketone (PEEK) are used to route wires through the enclosure to the electrodes for the application and detection of voltages and signals. All metallic components utilized in the assembly are either copper, aluminum, brass, or titanium with low magnetic susceptibilities to limit the production of magnetic field inhomogeneities.

Testing of the Penning trap magnetometer, for the LEBIT facility, was performed in a 7 T superconducting solenoid magnet. For test purposes, the Penning trap enclosure is wrapped with a solenoid to allow altering the overall strength of the magnetic field.

A National Instruments (NI) Peripheral component interconnect eXtensions for Instrumentation (PXI) chassis, model PXI-1042, was the main hub for communicating between the components of the Penning trap control system composed of LabVIEW programming software and all of the electronic devices needed to control and automate the frequency measurement and testing processes.

A digitizer recorded the output from a NF Corporation SA-420F5 low-noise Field-Effect Transistor (FET) differential amplifier that amplified the signal from the detection circuit. A PXI power supply controlled the voltages on the ring and endcap electrodes with an accuracy equal to 0.005% of the supplied output voltage. A DAQ module sets and monitors the electron beam emitter and extraction electrode parameters. A RIO FPGA module provided Transistor-Transistor Logic (TTL) signals that are used to time and trigger events during a cyclotron frequency measurement. A GPIB controller allows frequency generators and other electronics to be controlled by the Penning trap control system. The electronics controlled via GPIB include a Tektronix 3252 dual channel arbitrary function generator (for creation of RF fields), a B&K Precision 9123A programmable power supply (to heat the thermal emitter), a GwInstek PSM-2010 programmable power supply (to supply current to the coil wrapped around the Mini-Trap package), and a Keithley 6485 picoammeter (for electron beam current measurements). In addition, a custom-made bipolar switching power supply (controlled by the DAQ module) is utilized to bias the electron beam emitter.

To identify ion species in the trap, the reduced cyclotron motion of the ions was excited (using a dipole excitation) prior to detecting their magnetron motion. A 100 μs RF burst at a given frequency, $f_{RF}$, was applied at 5 Vpp in order to drive any ions, whose reduced cyclotron frequency $\approx f_{RF}$, out of the trap. A scan of $f_{RF}$ over a broad range is performed, and when $f_{RF} \approx f_+ = \omega_+/2\pi$ (of an abundant ion species in the trap) a decreased magnetron FFT resonance amplitude was observed. Using this method $H_3O^+$ was identified as the most abundant ion species in the trap and the reduced cyclotron frequency of $H_3O^+$ ($f_+ \approx 5.645$ MHz, in a magnetic field strength of 7 T) was determined.

Figure 7:
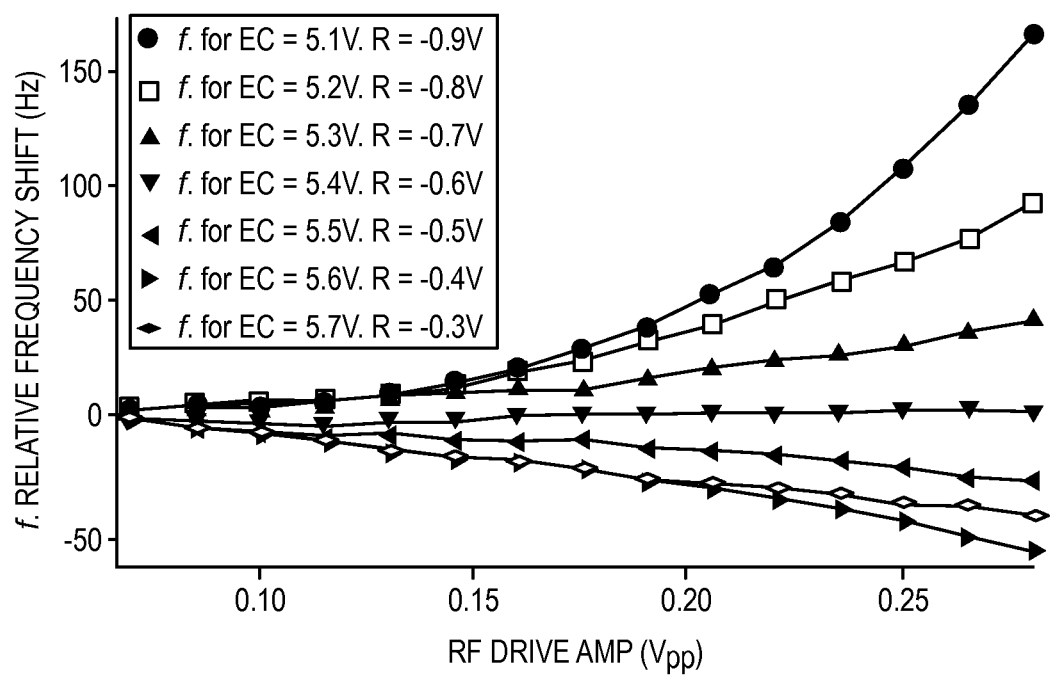
FIG. 7 is a plot of Penning trap tuning results showing the shift in $f_-$ as a function of drive amplitude (proportional to $\rho_-$) for seven different endcap(EC)-to-ring(R) voltage ratios for a 6 V potential well depth. The solid lines show the fits to the data, where the error bars are shown, but are too small to be resolved.

Trap tuning measurements were performed to determine shifts to the reduced cyclotron frequency of $H_3O^+$ by utilizing the same method used to generate the graph shown in FIG. 7, exciting the ions at $f_+$ instead of f and using narrow-band FT-ICR detection with the circuit carefully tuned to a resonant frequency $\approx f_+$. For these measurements, excitation times of $T_{RF} \approx 100$ μs were used to excite the reduced cyclotron motion of ions in a potential well depth of 8 V. An anharmonicity analysis similar to that discussed earlier indicated that the optimal endcap and ring voltages are 7.1 V and −0.9 V, respectively, resulting in an endcap-to-ring voltage ratio of 1 to −0.13. This value is in close agreement with the ratio of 1 to −0.14 found from simulations.

Figure 8:
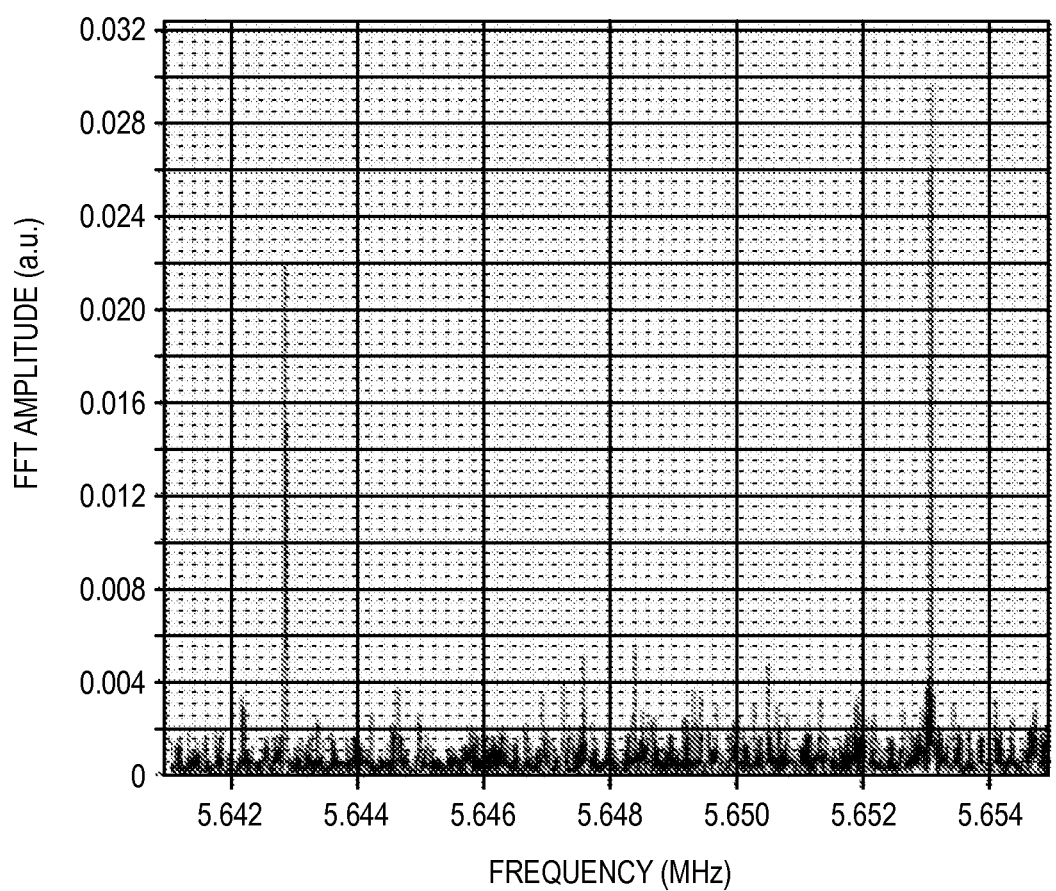
FIG. 8 is a LabVIEW screenshot of FFT resonances of both reduced cyclotron motion (left) and true cyclotron motion (right) of $H_3O^+$ ions in a 7.73 V potential well in the Penning trap (using an FT-ICR quadrupole configuration).

In addition to obtaining FFT resonances at $f_-$ and $f_+$, it is also possible to obtain an FFT resonance at ($f_+ + f_-$) which, for an ideal trap, is equal to the true cyclotron frequency, $f_c = \omega_c/2\pi$. Observation of the ($f_+ + f_-$) or $f_c$, resonance necessitates the implementation of a quadrupole detection scheme. Using this scheme, the image current was detected on two adjacent electrodes (rather than opposing electrodes, as in the dipole detection scheme). A screenshot of an FFT resonance of $f_c$ obtained using an FT-ICR quadrupole configuration is shown in FIG. 8 (where the $f_+$ resonance also visible is due to deviations from a perfect quadrupolar detection geometry).

To perform a measurement of $f_c$, the trapped ions will have some initial magnetron motion. This motion is induced by exciting the ions with a burst of RF power applied to one set of compensation electrodes for ~1.5 ms at a frequency $\approx f_-$. Then additional cyclotron motion is imparted to the ions by applying a burst of RF for ~100 μs at a frequency $\approx f_+$. Both the excitation voltages and the trapping potential were adjusted manually to obtain the $f_c$ resonance shown in FIG. 8.

To increase precision, an automated 3-dimensional search probing for shifts in both $f_c$ and $f_+$ was carried out by scanning $\rho_-$ over a range of endcap-to-ring voltage ratios for different cyclotron excitation amplitudes. The data from the optimization scan were analyzed to determine the best parameters that minimize shot-to-shot fluctuations while also minimizing shifts to $f_+$ and $f_c$ as a function of magnetron drive amplitude and resulted in the following applied values: endcap=6.985 to 6.990 V, ring=−0.745 to −0.750 V, magnetron excitation=0.615 to 0.635 Vpp, and cyclotron excitation (before being attenuated by 10 dB)=0.17 to 0.18 Vpp.

To probe the achievable precision of the Penning trap magnetometer in this example, deliberate changes to the magnetic field were introduced. The magnetic field was altered by passing a small current of hundreds of μA's, through the coil wrapped around the Penning trap enclosure.

Figure 9A:
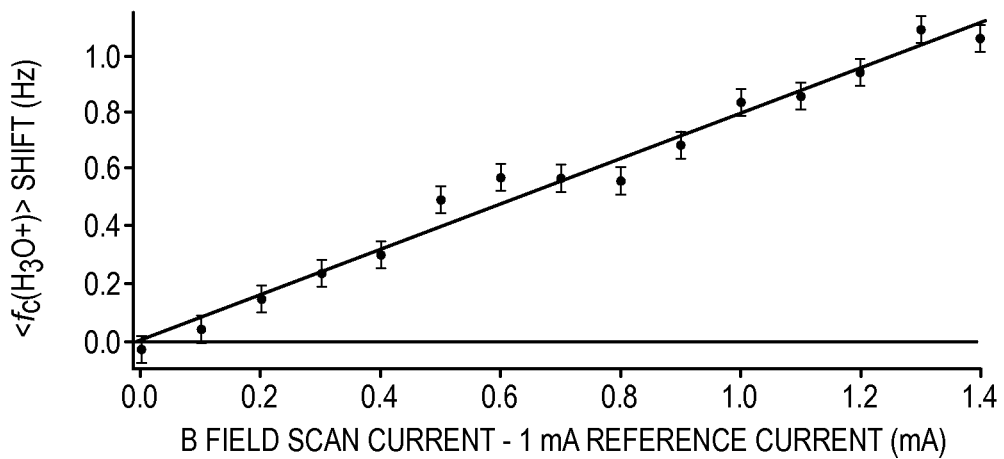
FIG. 9A illustrates the results of an alternating B field measurement to determine the average $f_c$ shift of $H_3O^+$ as a function of current passing through the coil surrounding the magnetometer.

To determine the achievable precision in detecting field changes, $f_c$ measurements were alternated between a reference coil current of 1 mA and $f_c$ measurements at different currents on a few-minute time scale to reduce sensitivity to longer time scale field changes. Five $f_c$ measurements at a given reference current were performed, followed by five $f_c$ measurements at a B field scan current. These 10 measurements were repeated 400 times to give 2000 $f_c$ measurements at each B field current, resulting in a total of 4000 $f_c$ measurements for each current setting. Data were taken for 15 different current settings in 100 μA steps, including the reference current. Each set of 2000 $f_c$ measurements were averaged and the statistic uncertainty was determined. The observed shift in $<f_c(H_3O^+)>$ was then calculated as the difference between the average of the 2000 $f_c$ measurements at the reference current and the B field scan current. The uncertainty in $<f_c(H_3O^+)>$ was calculated by adding the uncertainties of both individual uncertainties in quadrature. The results of an alternating B field measurement using a 1 mA reference current are presented in FIG. 9(a). The fit indicates a shift in $f_c$ by 0.8 Hz for a current change of 1 mA. Given $f_c \approx 5.653$ MHz for $H_3O^+$, this corresponds to a magnetic field change $\approx 10^{-6}$ T.

Figure 9B:
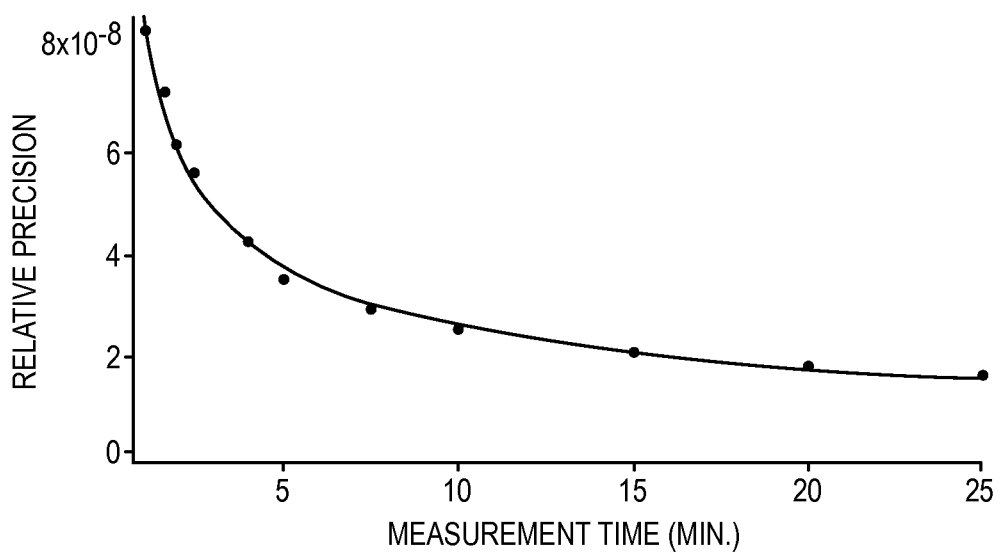
FIG. 9B illustrates the results to determine the measurement time to achieve a given relative precision (at a rate of 10 individual measurements per minute). Each data point in FIG. 9A represents 4000 $f_c$ measurements and the associated uncertainty; the solid horizontal bottom line is the zero-shift reference and the solid upwardly extending line is the linear best fit to the data (with a slope of 0.80(3) Hz/mA). The solid red line in FIG. 9B is the best fit to a square root power law.

To obtain the relative precision as a function of measurement time, the data from the alternating B field measurement were further analyzed to obtain the precision of the Penning trap magnetometer in detecting field changes. The data set was broken up into sets composed of various numbers of individual measurements. The results, shown in FIG. 9(b), indicate that a relative precision (at the 1σ level) of $<2\times10^{-8}$ is achieved by averaging two hundred individual measurements.

Figures 10A, 10B:
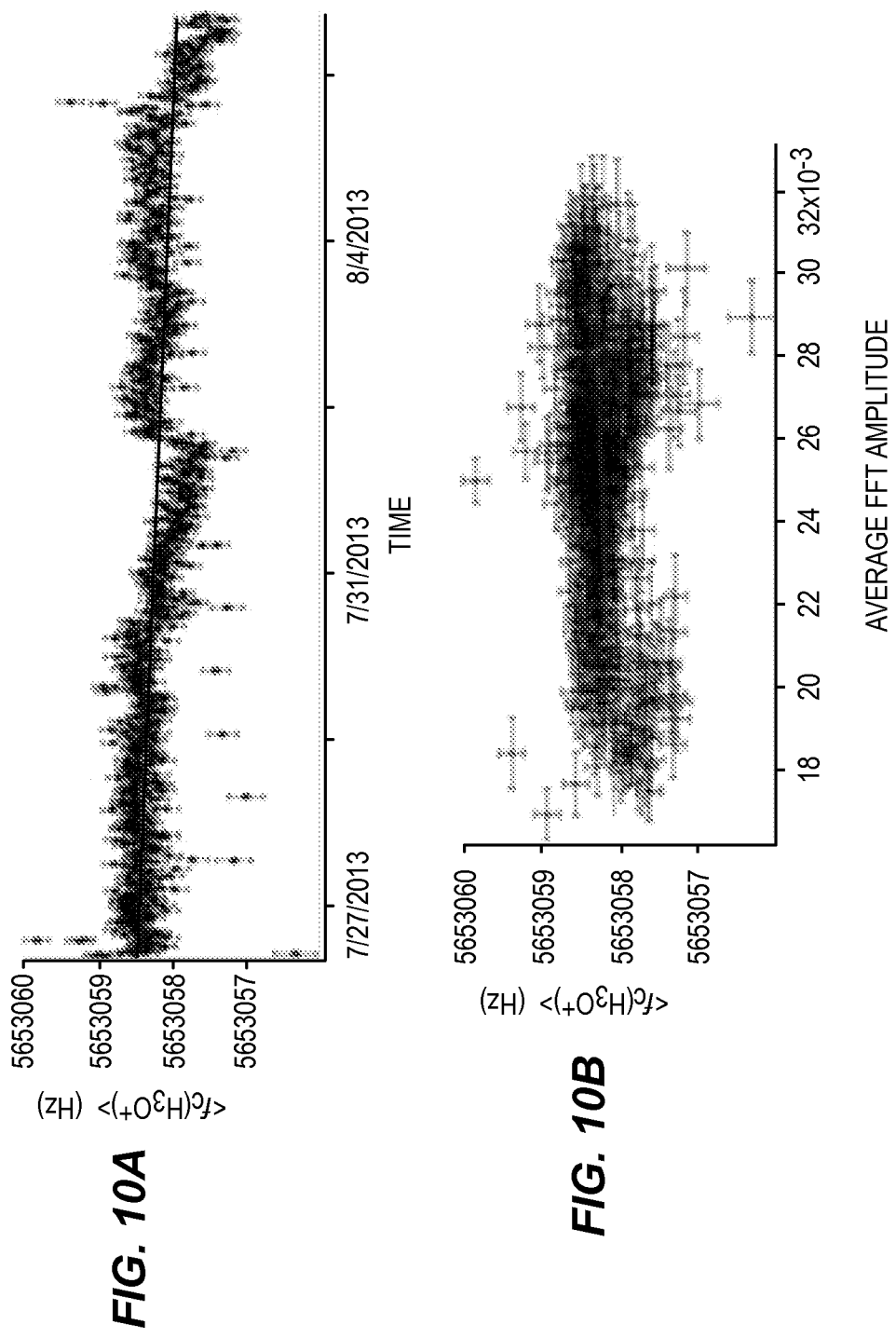
FIG. 10A illustrates the results of the long-term Penning trap monitoring test showing $<f_c(H_3O^+)>$ measurements over the course of 11 days and 9 hours.
FIG. 10B illustrates the Penning trap tests showing the frequency correlation with FFT amplitude (in arbitrary units). Each data point is the average of 100 frequency measurements (over a duration of 10 minutes) where the error bars correspond to the 1 uncertainty associated with the distribution of those 100 measurements. A linear best fit to the $f_c$ data is shown in FIG. 10A and corresponds to a magnetic field decay rate of $-3.3(2) \times 10^{-10}$ hr$^{-1}$.

A long-term $<f_c(H_3O^+)>$ monitoring test was performed to track the drift of the 7 T superconducting magnet and to verify the overall performance of the Penning trap magnetometer. The monitoring test ran continuously for eleven days and nine hours. The results are shown in FIG. 10(a) where each data point represents the average of 100 individual measurements.

One feature to note is the momentary increase in $f_c$ that occurred just after the start of the monitor and once again near the end. Both of these shifts occurred during the liquid nitrogen (LN2) fill of the magnet and were correlated with the duration of the fill (~30 minutes).

A second feature was occasional short duration negative shifts in $f_c$ that occur throughout the data set. The duration of the temporary shifts of $f_c$ ranged from 5 to 15 minutes, and the extent of the shift ranged from 0.5 to 2 Hz. The data were analyzed for correlations in amplitude. FIG. 10(b) shows $<f_c(H_3O^+)>$ plotted as a function of FFT amplitude. The small linear dependence of $<f_c(H_3O^+)>$ on FFT amplitude is observed which for the range of amplitudes used corresponded to a frequency shift on the order of the precision of the Penning trap, but nothing significant was found.

In this example, a high-precision magnetometer capable of monitoring changes in strong uniform magnetic fields to a precision on the order of 1 part in $10^8$ was developed using a miniature cylindrical Penning trap in the open-endcap configuration. Analytical and numerical simulations identified the optimal trap geometry parameters to maximize the precision of the Penning trap magnetometer. Tests in a 7 T superconducting magnet demonstrated that the Penning trap can detect changes in strong magnetic fields with a relative precision of nearly 1 part in $10^8$, with a temporal resolution of ~30 minutes, by monitoring the cyclotron frequency of $H_3O^+$.

While we demonstrated 1 ppb in this example, the present techniques may be used to measure magnetic fields in high radiation environments with precision of 1 ppm ($10^{-6}$) or higher.

While various aspects of the present invention have been described with reference to specific examples, which are intended to be illustrative only and not to be limiting of the invention, changes, additions and/or deletions may be made to the disclosed embodiments without departing from the scope of the invention.

What is claimed:

1. A device for measuring magnetic fields in a high radiation field environment, the device comprising:
   a charged particle trapping structure comprising two opposing end cap electrodes each on opposite ends of a central ring electrode structure, the opposing electrodes and the ring electrode structure collectively defining an inner chamber, with the inner chamber adapted (i) for generation of charged particles within the inner chamber through ionization of neutral atoms or molecules and adapted for trapping generated charged particles or (ii) for the capture and trapping of externally generated charged particles, in the presence of a magnetic field and a static electric potential created from voltages supplied to the charged particle trapping structure;
   a radio frequency generator coupled to the charged particle trapping structure to generate an electric field inside the inner chamber to excite or maintain cyclotron motion of the charged particles within the inner chamber, wherein the charged particle trapping structure is adapted to detect the cyclotron frequency of the charged particles within the inner chamber over an operating environment range of an accumulated radiation dose of 1 MGy or above; and
   an electronic detector adapted to determine a value of the detected cyclotron frequency and to determine a magnetic field strength of the magnetic from the cyclotron frequency.

2. The device of claim 1, wherein the device is adapted to measure the magnetic field strength by measuring the cyclotron frequency of the charged particles within the inner chamber with an accuracy of 10 parts per million or better over the operating environment range of the accumulated radiation dose.

3. The device of claim 1, wherein the electronic detector comprises:
   a radio frequency measurement device; and
   a processor connected to the radio frequency measurement device, wherein the processor is configured to analyze a received radio frequency signal and to determine a radio frequency corresponding to the charged particles within the inner chamber, wherein the radio frequency measurement is accurate to 10 parts per million or better over the operating environment range of the accumulated radiation dose.

4. The device of claim 3, wherein the processor is further configured to convert the cyclotron frequency to a magnetic field strength experienced by the charged particles within the inner chamber.

5. The device of claim 1, wherein the charged particle trapping structure is a Penning trap.

6. The device of claim 5, wherein the two opposing end cap electrodes and the ring electrode structure are formed of one or more metals, and wherein the Penning trap comprises isolating material that positions each electrode in the ring electrode structure and between the ring electrode structure and the two opposing end cap electrodes in place, the isolating material being of a one or more ceramics, glass, or other inorganic insulating and highly radiation resistant material.

7. The device of claim 1, wherein the trapping structure is adapted for generation of electrons that can be introduced into the inner chamber.

8. The device of claim 1, wherein the trapping structure is adapted for generation of light ions of stable isotopes within the inner chamber.

9. The device of claim 1, wherein the operating environment radiation range is between 1 MGy and 100 MGy.

10. The device of claim 1, wherein the operating environment radiation range is above 100 MGy.

11. The device of claim 1, wherein the charged particle trapping structure is adapted to measure the strength of the magnetic field with an accuracy of 1 parts per million or greater.

12. A method for measuring the strength of a magnetic field, the method comprising:
   generating target charged particles within a Penning trap or injecting the target charged particles into the Penning trap;
   maintaining the target charged particles within the Penning trap, such that for a given trap radius and trap length, applying a static magnetic field and a quadrupole electric field within the Penning trap maintains the target charged particles within the Penning trap for at least a measurement cycle;
   measuring the cyclotron frequency using an image charge resonance detection technique measuring radial motion of the target charged particles; and
   determining a field strength of the magnetic field from the cyclotron frequency,
   wherein the Penning trap is sized for measuring the field strength with an accuracy of 10 parts per million or greater, over an operating environment radiation range of 1 MGy or above.

13. The method of claim 12, wherein the image charge resonance detection technique is a Fourier transform-ion cyclotron resonance (FT-ICR) technique.

* * * * *